(12) United States Patent
Kaplinsky

(10) Patent No.: US 6,188,629 B1
(45) Date of Patent: Feb. 13, 2001

(54) LOW POWER, STATIC CONTENT ADDRESSABLE MEMORY

(76) Inventor: Cecil H. Kaplinsky, 140 Melville Ave., Palo Alto, CA (US) 94301

(*) Notice: Under 35 U.S.C. 154(b), the term of this patent shall be extended for 0 days.

(21) Appl. No.: 09/434,713

(22) Filed: Nov. 5, 1999

(51) Int. Cl.$^7$ .................................................. G11C 7/00
(52) U.S. Cl. ........................................ 365/230.03; 365/49
(58) Field of Search .............................. 365/49, 230.03

(56) References Cited

U.S. PATENT DOCUMENTS

| | | | |
|---|---|---|---|
| 4,443,860 | * 4/1984 | Vidalin | 365/49 |
| 4,959,811 | * 9/1990 | Szczepanek | 365/49 |
| 5,386,379 | 1/1995 | Ali-Yahia et al. | 365/49 |
| 5,452,243 | 9/1995 | Ansel et al. | 365/49 |
| 5,475,633 | 12/1995 | Mehalel | 365/154 |

OTHER PUBLICATIONS

Hiroshi Kadota et al., "An 8–kbit Content–Addressable and Reentrant Memory", *Journal of Solid–State Circuits*, vol. SC–20, No. 5, Oct. 1985, pp. 951–956.

Simon R. Jones et al., "A 9–kbit Associative Memory for High–Speed Parallel Processing Applications", *Journal of Solid–State Circuits*, vol. 23, No. 2, Apr. 1988, pp. 543–548.

* cited by examiner

*Primary Examiner*—Terrell W. Fears
(74) *Attorney, Agent, or Firm*—Thomas Schneck

(57) ABSTRACT

A low power, static content addressable memory having combinatorial logic gates to connect the selection lines of a plurality of memory cells in a manner that does not compromise the stability of the cells. In one embodiment, each memory cell has one set of complementary bit lines, while in a second embodiment, each memory cell has two or more sets of bit lines to allow simultaneous read operations or simultaneous read and write operations. Because precharging of the selection line is not required, the memory consumes less power in operation.

11 Claims, 4 Drawing Sheets

| Fig. 4a | Fig. 4b |

LOW POWER, STATIC CONTENT ADDRESSABLE MEMORY

TECHNICAL FIELD

The present invention relates to a static content addressable memory having a memory plane constituted by an array of CMOS static memory cells.

BACKGROUND ART

A content addressable memory (CAM), also known as an associative memory, is a data storage device in which a location is identified by its informational content rather than by the names, addresses, or relative positions, and from which the data may be retrieved. For applications requiring content addressable processing, existing solutions make use of content addressable memories having a memory plane formed by an array of CMOS static memory cells.

U.S. Pat. No. 5,452,243 to Ansel et al. discloses a fully static CAM cell with low write power (minimum power supply current surges), but it has a total of seventeen transistors in the disclosed embodiment. It would be desirable to have a smaller memory cell that uses fewer transistors. U.S. Pat. No. 5,475,633 to Mehalel discloses a four-transistor cache memory cell. However, the cell disclosed is pseudo-static and still requires refresh operations to be performed. It would be desirable to have a static memory cell that does not require refresh operations.

U.S. Pat. No. 5,386,379 to Ali-Yahia et al. discloses a static CAM cell using eight transistors. The transistors are divided into two arrays, the first array having a data storage function and the second array having a comparison function between the stored data item and a data item being applied to the input of the cell, the comparison result being obtained on a selection line. In the first embodiment, the first array comprises four transistors for storage purposes and two access transistors connected to two bit lines and a word line, the second array comprises two transistors, the two access transistors of the first array being associated with these two transistors of the second array in order to ensure the comparison function, the data item to be compared being applied to the bit lines connected to the two access transistors of the cell. The selection line is preloaded during reading-writing operations and during comparison operations. A second ten-transistor cell embodiment in the patent eliminates the need to preload the selection line; however two additional transistors need to be added to the cell.

The eight-transistor memory cell of Ali-Yahia et al. operates well in isolation. However, there is a problem that occurs when more than one memory cell is on the same selection line. Referring to FIG. 2, which shows the memory cell described in Ali-Yahia et al., the selection line 29 is always preloaded to a "1" logic state. Nodes 91 and 92 are storage cells for data written into the memory cell. When bit line 28 is loaded to "1" and bit line 27 is loaded with a "0", there is a match and current flows from ground to Vdd through transistors 31 and 32, and node 91 of the cell will be pulled towards ground. However, if bit line 28 is loaded with a "0" and bit line 27 is loaded with a "1", there is not a match, and current flows from Vdd to ground through transistors 34 and 33 and node 92 is pulled towards Vdd. Therefore, if a matching cell and a non-matching cell are on the same selection line 29, there will be a mismatch on the selection line as the matching cell will be pulled towards ground and the non-matching cell will be pulled towards Vdd. This could cause the state of one of the cells to change to the opposite state, thus compromising the stability of the memory cell. This problem can be obviated by making node 91 large, such that it can source a greater amount of current than the current that flows through transistors 34, 33 and 37 to ground. Thus, it would be necessary to make the saturated drain current at node 91 much larger than the saturated drain current of transistor 36. However, it would be desirable not to have to be concerned with having to increase the size of node 91 to avoid compromising the stability of the memory cell.

Another problem that could occur would be in the case where there are more than two memory cells—for example N cells, where N is typically 24–32 bits wide. Then, if all but one cell match, then there will be (N−1) cells having transistors of the size of node 91 pulling the selection line 29 up and only one cell having one transistor 31 or 33 pulling the match line 29 through transistors 36 or 37. Since there is only one cell driving the line low and (N−1) cells driving the line high, the voltage on the selection line 29 will stay high and the mismatch will not be detected.

Additionally, even if the circuit of Ali-Yahia et al. could be made to work with multiple cells, it is not a low power solution. In the first embodiment of Ali-Yahia et al., it is necessary to precharge the selection line 29 in order to avoid the transistors of the comparison logic 36 and 37 forming an unloading path from the match line into the storage cells 91 and 92, which could also compromise the stability of the memory cell. In CAMs, only one line matches at a time, so if there are M words in the memory, then every (M−1) signals will have to be precharged and discharged for every cycle. This precharging and discharging consumes power equal to $(C \times Vdd^2 \times F)$, where C is the capacitance of the signal and F is the operating frequency. It would be desirable not to have to precharge the match line.

In a multiprocessor system, there is a need to keep the caches coherent, as the introduction of caches can cause a coherence problem for multiprocessors if the view of memory through the cache of one processor is different from the view of memory obtained through the cache of another processor. To keep the caches coherent involves two entities, the processor and the bus, looking at the look up mechanism simultaneously. However, using common methods known in the art, such as dual look up mechanisms or inclusion methods, problems occur when updating one of the look up mechanisms by one entity while the other is accessing the look up mechanism. To eliminate these problems, it would be desirable to provide a content addressable memory with more than one access port to allow two simultaneous read operations or to allow simultaneous read and write operations.

It is an object of the present invention to provide a static content addressable memory that is fast, uses a minimal amount of transistors and operates when multiple memory cells are provided in a manner that does not compromise the stability of the memory cells.

It is a further object of the invention to provide a static CAM that does not require precharging, and thus requires less power.

It is another object of the invention to provide a dual port cam which allows two simultaneous read operations or simultaneous read and write operations in order to keep the memory caches coherent.

SUMMARY OF THE INVENTION

The above objects have been achieved by a low power, static content addressable memory having combinational logic gates to connect the selection lines of a plurality of memory cells in a manner that does not compromise the stability of the memory cells. In a first embodiment, each individual memory cell is basically the same as the first eight-transistor Ali-Yahia cell (FIG. 2) except that its selection line is not preloaded. The combinatorial logic gates isolate the selection line of a cell from the selection lines of other memory cells, such that there would be no occurrence of data flowing back into the cell through the selection line.

By using combinatorial logic gates, instead of a wire AND gate as in the previously described prior art, the selection lines can be combined without mismatch errors occurring. Each selection line is effectively isolated from the selection lines of other memory cells so that the stability of the memory is not compromised. Because precharging the selection line is not done, less power is consumed in the operation of the circuit.

In a second embodiment, the memory cell is a dual-port cell having two or more sets of bit lines to allow simultaneous reads or a simultaneous read and write. Because the dual-port version of the memory cell allows simultaneous reads or a simultaneous read and write, the invention allows for operation of snooping cache-coherence protocols in a multiprocessor system.

BEST MODE FOR CARRYING OUT THE INVENTION

Figure 1:
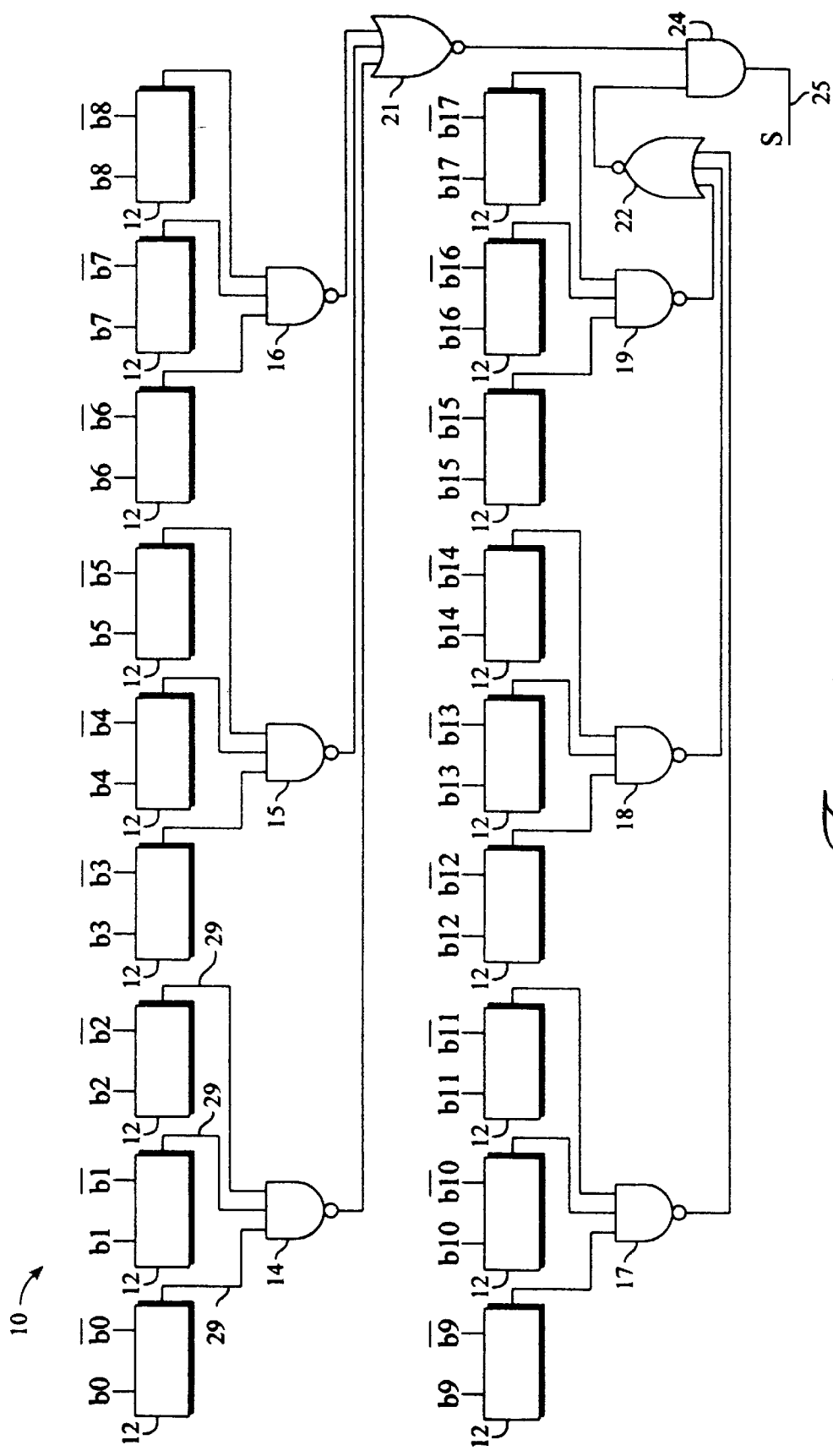
FIG. 1 is a gate-level schematic diagram of the CAM according to the first embodiment of the invention.

Referring to FIG. 1, the content addressable memory 10 includes a plurality of memory cells 12. Each of the memory cells 12 is constructed with the same structure as the first eight-transistor memory cell described in U.S. Pat. No. 5,386,379 to Ali-Yahia et al. and as shown here in FIG. 2. However, the manner in which the cells are connected into an array of cells differs because of the present invention's use of combinatorial logic gates 14–19, 21, 22, and 24. Also, unlike the prior operation taught by Ali-Yahia et al., the selection line 29 in the present invention is not precharged.

Figure 2:
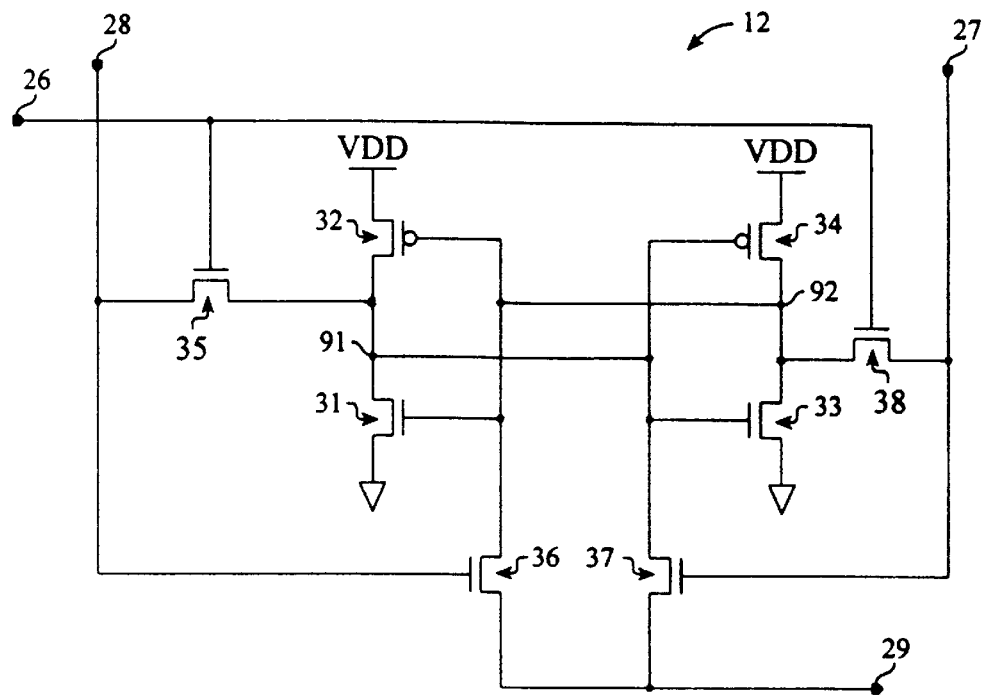
FIG. 2 is a transistor-level schematic diagram of the memory cell of the prior art which is also used in the first embodiment of the invention.

With reference to FIG. 2, the memory cell has a first array of CMOS transistors which perform a storage function. The four transistors 31–34, form a double inverter to fulfill the storage function. The storage array also has two access transistors 35 and 38, each access transistor being connected at its gate to a word line 26 and at its drain (or source) to complementary bit lines 28 and 27. A second array of CMOS transistors fulfills the comparison function between an inputted data and a stored data item in the memory cell. The second array comprises two transistors 36 and 37 connected to the access transistors 35, 31, 33, and 38. The comparison function is fulfilled by the exclusive OR logic gate obtained by these two transistors 36 and 37 associated with the transistors 31 and 33 of the memory cell. Each of the transistors 36 and 37 are connected to the selection line 29 at its source (or drain) and to the bit lines at its gate. The drains of transistors 32 and 34 are connected to a power supply Vdd and have sources connected to the drains of transistors 31 and 33 respectively. The gates of transistors 32 and 31 are connected together and are also connected to the drain of transistor 36. The gates of transistors 34 and 33 are connected together and are also connected to the drain of transistor 37.

Referring to FIG. 2, the reading operation of the memory cell 12 is as follows. Nodes 91 and 92 are storage cells for the data written into the memory cell. For explanation purposes, it is assumed that cell 91 has a state equal to "1" and that cell 92 equals a state "0". If a bit line 28 is loaded with a "1" and bit line 27 is loaded with a "0" and word line 26 is loaded with a "1", then the bit line 27 will be unloaded across transistors 38 and 33 and the values of cells 91 and 92 will be obtained on the lines 28 and 27. The memory cell can also be used for a writing operation. If it is desired to write a "0" into cell 91 and a "1" into cell 92, then a "0" would be applied to bit line 28 and a "0" would be applied to bit line 27. The word line 26 would be positioned at "1" and the transistors 35 and 38 would be conductive. The cell 91 would be unloaded into the bit line 28 across the transistor 35, and cell 92 would be forced to a "1" by the switching of the memory cell.

A comparison operation can be implemented to determine whether the values on the bit lines 28 and 27 match the values stored in the memory cells 91 and 92. For example, in a situation where there is a match, bit line 27 would match the contents of cell 91 and bit line 27 would match the contents of cell 92. Assuming that cell 91 has a state equal to "1" and cell 92 has a state equal to "0", a match would occur if bit line 27 was loaded to a "1" and bit line 28 was loaded to a "0". For a comparison operation,. the word line 26 is loaded to "0", shutting off the operation of transistors 35 and 38. Transistor 36 would be conductive and transistor 37 would be blocked, putting a "0" from cell 92 on the selection line 29, through transistor 36. A "0" state on the selection line 29 indicates that there is no match, while a "1" on the selection line 29 indicates that there is a match. If bit line 28 was loaded with a "0" and bit line 27 was loaded with a "1" (and assuming the same states of the cells, cell 91 being "1" and cell 92 being "0"), then transistor 36 would be blocked and transistor 37 would be conductive, transmitting a "1" from cell 91 through transistor 37 to the selection line 29, indicating that there is a match.

Referring back to FIG. 1, the content addressable memory 10 of the present invention includes a plurality of memory cells 12. In FIG. 1, there are a group of eighteen content addressable memory cells 12 shown. These cells can, for example, store a 16-bit word and two parity bits. A lesser or greater number of memory cells 12 may be used depending on the particular application. The group of cells 12, shown in FIG. 1, typically forms one of many storage locations in a memory, and for which a content match can be sought. Each cell 12 has a pair of complementary bit lines (e.g. bo, b̄o) and a selection line 29. The selection lines 29 are combined with selection lines of the other cells using combinatorial logic gates. In the preferred embodiment, each group of three memory cells 12 have selection lines 29 that are combined into the input of a NAND gate 14. The output of NAND gate 14 is combined with the outputs of NAND gates 15 and 16, which had combined the selection lines of other memory cells, and the outputs of the NAND gates are supplied to a NOR gate 21, which produces an output. Likewise, the selection lines of other memory cells 12 are combined into NAND gates 17, 18 and 19 and the outputs of the NAND gates are input into NOR gate 22 producing an output. The outputs of NOR gates 21 and 22 are supplied to the input of an AND gate 24. The output of AND gate 24 results in a full match selection line 25. The following describes how the content addressable memory 10 of the present invention eliminates the problems associated with the prior art CAMs described above. In the case where all of the outputs on the selection lines 29 of the memory cells match, a match would be indicated on the selection line 25. First, take as an example the case where all the outputs 29 of the memory cells 12 are in a logic level 1 state. Referring to the three inputs 29 to the NAND gate 14, if all three inputs to NAND gate 14 are at logic level 1, the output of NAND gate 14 will be a logic level 0. If all of the selection lines 29 carry the logic level 1, then the outputs of all of the NAND gates 14–19 would all be logic level 0. Three logic level 0 inputs into NOR gate 21 would produce a logic level 1 on the output of NOR gate 21. Similarly three logic level 0 inputs into NOR gate 22 would produce a logic level 1 output of NOR gate 22. The two logic level 1 inputs into AND gate 24 would produce a logic level 1 output on full match selection line 25, indicating that all of the cells match. If any one of the selection line outputs 29 of the memory cells 12 does not match, the output on selection line 25 will be a logic level 0, indicating that there is a mismatch. For example, if one of the outputs of memory cell 12 being input into NAND gate 14 is a 0, and the other two inputs are 1's, the output of NAND gate 14 would be a 1, which when supplied into NOR gate 21 would produce a logic level 0 output which would be supplied to AND gate 24 producing a 0 on the selection line 25. This avoids the case that occurs in the prior art, described above, where a cell that does not match could be undetected or could switch logic states due to the use of a wire AND gate. Because the present invention uses combinatorial logic gates to combine the selection lines, a cell that does not match can be detected by the logic gates. Additionally, the logic gates serve to isolate the memory cells from other memory cells so that the stability of the memory cells will not be compromised.

Figure 3:
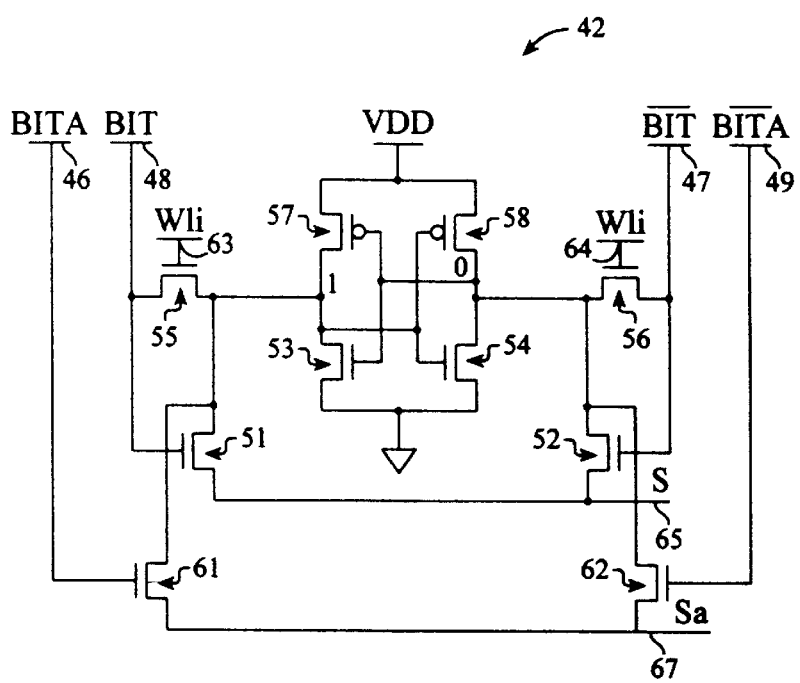
FIG. 3 is a transistor level schematic diagram of a dual-port memory cell used in the second embodiment of the invention.

Referring to FIG. 3, a second embodiment of the memory cell 42 of the present invention is shown. The memory cell 42 is similar to that described in FIG. 1, except that two sets of complementary bit lines are provided. The dual port memory cell allows two simultaneous read operations or simultaneous read and write operations. In a multiprocessor system, there is a need to keep the caches coherent and this involves two entities, the processor and the bus, looking at the look up mechanism simultaneously. The dual port CAM allows updating of one of the look up mechanisms by one entity, while the other entity is accessing the look up mechanism. In FIG. 3, a first array of CMOS transistors fulfill the storage function for the cell and is formed by the transistors 57, 58, 53 and 54, as well as by the access transistors 55 and 56. The comparison function is fulfilled by the exclusive OR logic gates obtained by the second array of CMOS transistors, transistors 51 and 52 associated with transistors 53 and 54 of the memory cell and by transistors 61 and 62 associated with transistors 53 and 54 of the memory cell. Transistors 51 and 52 are connected to the first selection line 65, while transistors 61 and 62 are connected to the second selection line 67. Two sets of complementary bit lines BIT 48, $\overline{\text{BIT}}$ 47 and BITA 46, $\overline{\text{BITA}}$ 49 are provided. Bit lines BIT 48 and $\overline{\text{BIT}}$ 47 are connected to the gates of transistors 51 and 52, while bit lines BITA 46 and $\overline{\text{BITA}}$ 49 are connected to the gates of transistors 61 and 62. The operation of the circuit of FIG. 3 is identical to the operation of the circuit of FIG. 1, except for the addition of the extra set of bit lines BITA 46 and $\overline{\text{BITA}}$ 49 which, through transistors 61 and 62, produce the second selection line 67.

Figures 4, 4A:
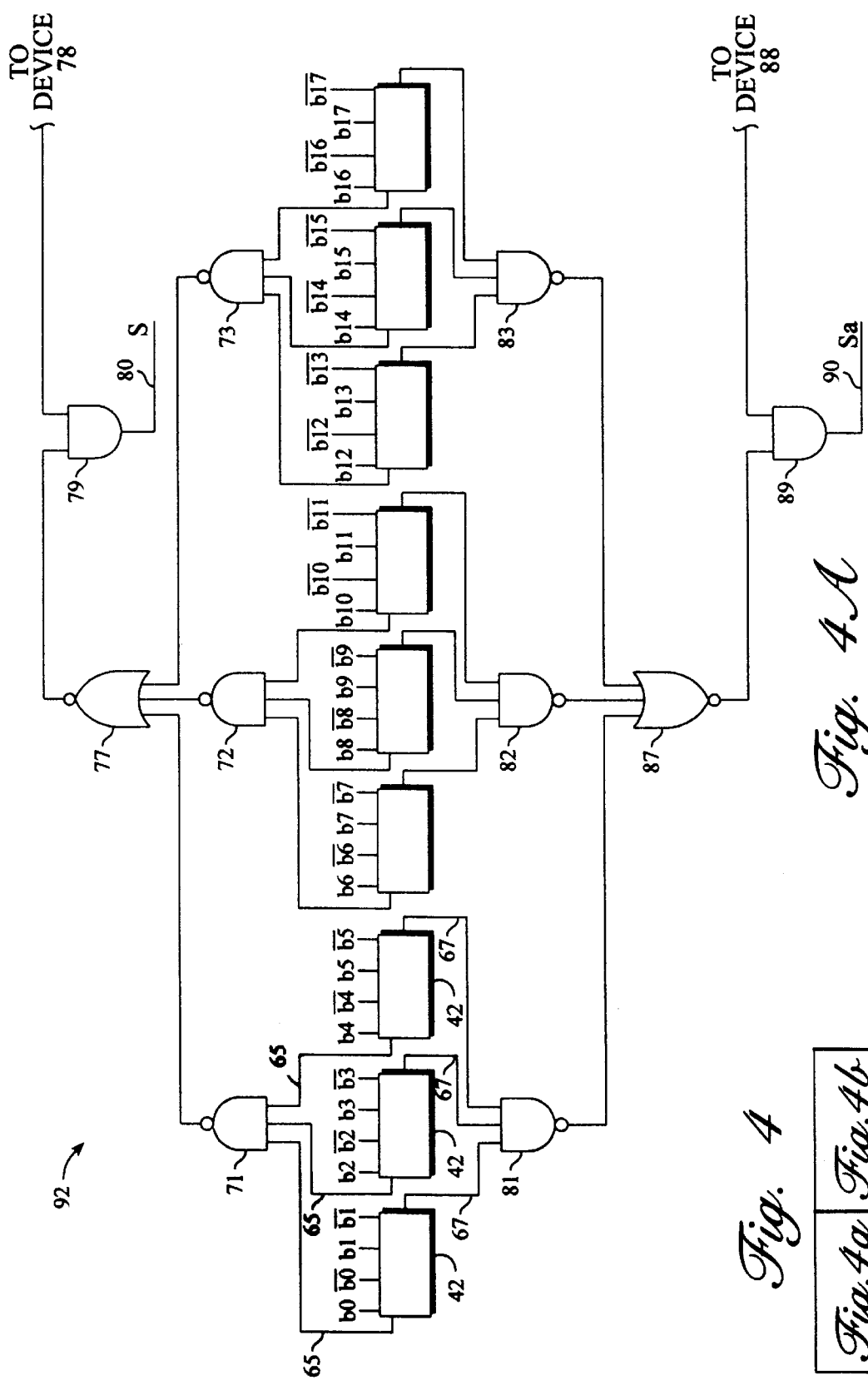
FIG. 4, consisting of FIGS. 4A and 4B, is a gate-level schematic diagram of the CAM according to the second embodiment of the invention.
Figure 4B:
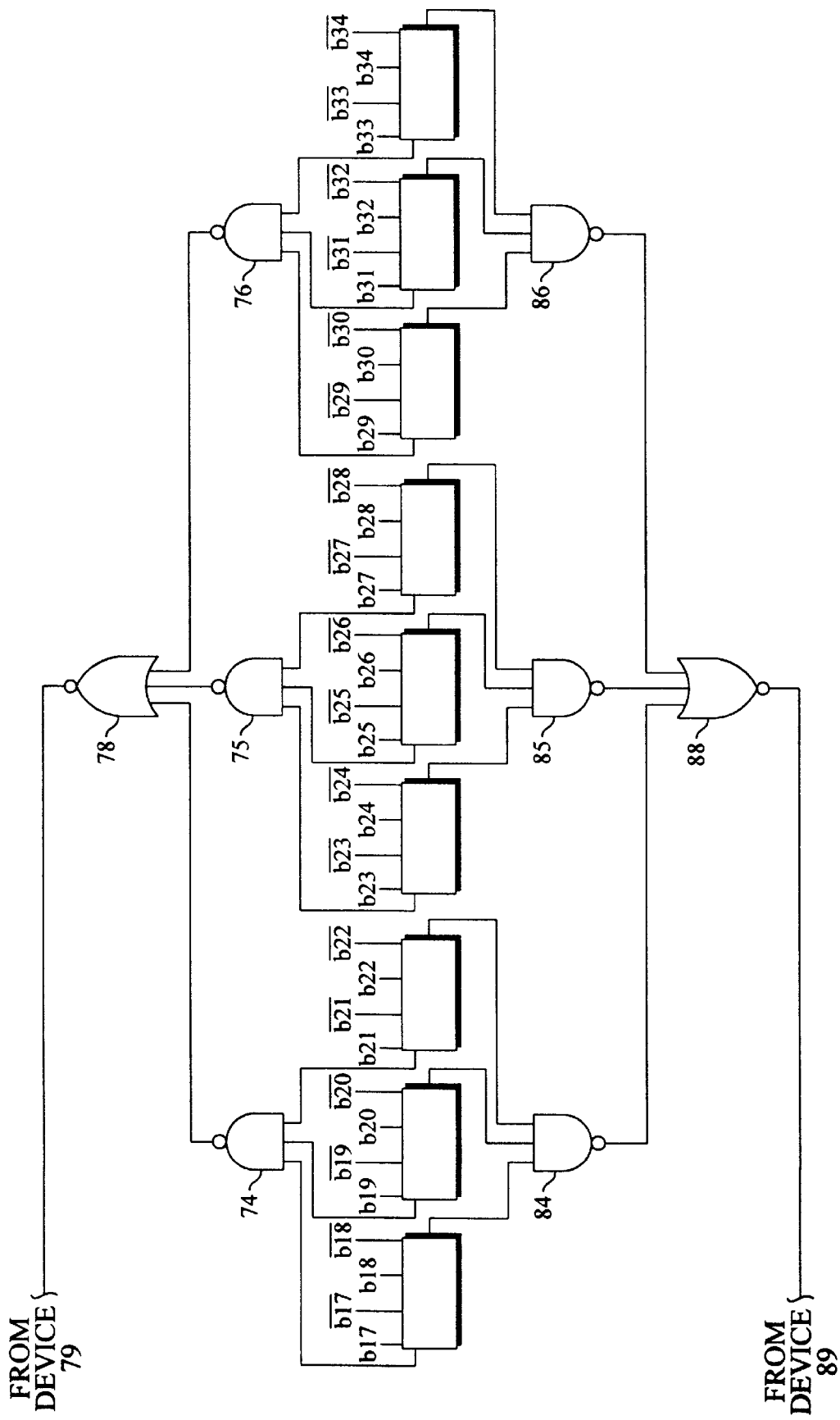

FIG. 4, consisting of FIGS. 4A and 4B, show the complete content addressable memory 92 using the memory cell 42 having the dual access ports. Each cell 42 has two sets of bit lines and two selection lines so the logic needed to produce the full selection line is duplicated from the circuit shown in FIG. 1. As shown in FIG. 4, the first set of selection lines 65 of the memory cells 42 are input into NAND gates 71–76 and the outputs of NAND gates 71–76 are input into NOR gates 77 and 78. The outputs of the NOR gates 77 and 78 are input to an AND gate 79, producing a match selection line 80 on the output of AND gate 79. The second set of selection lines 67 from the memory cells 42 are input into NAND gate 81–86. The outputs of NAND gates 81–86 are input into NOR gates 87 and 88. The outputs of the NOR gates 87 and 88 are input into AND gate 89 and the output of the AND gate 89 produces a match selection line 90. Thus, the combinatorial logic employed in FIGS. 1 and 4 is the same, except that there are twice as many logic gates in the circuit of FIG. 4 because there are two selection lines for each memory cell 42.

Again, the memory cells can be combined on a selection line without the mismatch problems found in the prior art. If there is a mismatch on the line it is detected immediately by the combinatorial logic gates of the content addressable memory. Because neither of the memory cells described in FIGS. 2 or 3 need to be preloaded when used in the embodiments shown in FIGS. 1 and 4, less power is consumed in the operation of the content addressable memory.

What is claimed is:

1. A low power, static content addressable memory comprising:

a plurality of memory cells, each memory cell having a set of complementary bit lines and including a first array of transistors for storing data and a second array of transistors for comparing a stored data item and a data item applied to the cell by the bit lines and producing a result on a selection line, the first array of transistors consisting of four storage transistors and two access transistors, the two access transistors being connected to the bit lines and to a word line. and the second array consisting of two transistors, as well as the two access transistors from the first array, in order to perform a comparison function; and a plurality of combinational logic gates having inputs provided from the selection lines of the memory cells and producing an output which is a full match line.

2. A low power, static, dual port, content addressable memory comprising:

a plurality of memory cells, each memory cell having two or more sets of complementary bit lines and including a first array of transistors for storing data and a second array of transistors for comparing a stored data item and a data item applied to the cell by the bit lines and producing a result on a selection line, the first array of transistors consisting of four storage transistors and two sets of access transistors, each set of access transistors consisting of two access transistors, each access transistor being connected to one of the sets of bit lines and to a word line, and the second array consisting of two transistors, as well as the two sets of access transistors from the first array in order to perform a comparison function; and a plurality of combinatorial logic gates having inputs provided from the selection lines of the memory cells and producing an output which is a full match line.

3. A low power, static, dual port, content addressable memory, as in claim 2, wherein the memory cell is adapted to perform two simultaneous READ operations.

4. A low power, static, dual port, content addressable memory, as in claim 2, wherein the memory cell is adapted to perform a READ operation and a WRITE operation simultaneously.

5. A low power, static, dual port, content addressable memory, as in claim 2, wherein the combinatorial logic gates produce an output indicating a match only when all of the inputs are in a same logic state.

6. A low power, static content addressable memory comprising:
- a plurality of memory cells, each memory cell having a set of complementary bit lines and including a first array of transistors for storing data and a second array of transistors for comparing a stored data item and a data item applied to the cell by the bit lines and producing a result on a selection line;
- a plurality of NAND gates, each NAND gate having inputs provided from the selection lines of the memory cells and producing an output;
- a plurality of NOR gates, each NOR gate having inputs provided from the outputs of the NAND gates and producing an output; and
- one or more AND gates having inputs provided from the outputs of the NOR gates, providing an output which is a full match line.

7. A low power, static content addressable memory, as in claim 6, wherein the first array of transistors comprises four storage transistors and two access transistors, the two access transistors being connected to the bit lines and to a word line, and wherein the second array comprises two transistors, as well as the two access transistors from the first array in order to perform a comparison function.

8. A low power, static content addressable memory, as in claim 6, wherein each of the memory cells has two or more set of complementary bit lines, and two or more selection lines.

9. A low power, static content addressable memory, as in claim 8, wherein each of the memory cells is adapted to perform a READ operation and a WRITE operation simultaneously.

10. A low power static content addressable memory, as in claim 8, wherein each of the memory cells is adapted to perform two simultaneous READ operations.

11. A low power, static content addressable memory, as in claim 8, wherein the first array of transistors comprises four storage transistors and two sets of access transistors, each set of access transistors consisting of two access transistors, each access transitor connected to one of the sets of bit lines and to a word line, and wherein the second array comprises two transistors, as well as the two sets of transistors from the first array, in order to perform a comparison function.

* * * * *